(12) United States Patent
Fujita

(10) Patent No.: US 12,706,603 B2
(45) Date of Patent: Aug. 11, 2026

(54) PROGRAMMABLE GATE VOLTAGE FOR ON RESISTANCE CONTROL OF POWER MODULE

(71) Applicant: Renesas Electronics Corporation, Tokyo (JP)

(72) Inventor: Takashi Fujita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 77 days.

(21) Appl. No.: 18/672,654

(22) Filed: May 23, 2024

(65) Prior Publication Data

US 2025/0364986 A1 Nov. 27, 2025

(51) Int. Cl.
*H03K 17/30* (2006.01)
*H03K 17/082* (2006.01)

(52) U.S. Cl.
CPC ....... *H03K 17/302* (2013.01); *H03K 17/0822* (2013.01); *H03K 2217/0063* (2013.01); *H03K 2217/0072* (2013.01)

(58) Field of Classification Search
CPC ............. H03K 17/302; H03K 17/0822; H03K 2217/0063; H03K 2217/0072
See application file for complete search history.

(56) References Cited

U.S. PATENT DOCUMENTS 6,320,449 B1 * 11/2001 Capici .................. H03K 17/687 323/284
7,061,217 B2 * 6/2006 Bayer .............. H03K 17/08122 323/317
8,258,822 B2 * 9/2012 Tumminaro ..... H03K 17/04123 327/108
11,728,791 B2 * 8/2023 Lee ....................... H02M 1/083 327/124
2015/0372678 A1 * 12/2015 Zhang ............ H03K 19/017509 327/109

* cited by examiner

*Primary Examiner* — Menatoallah Youssef
*Assistant Examiner* — Colleen J O Toole
(74) *Attorney, Agent, or Firm* — SCULLY, SCOTT, MURPHY & PRESSER, P.C.

(57) ABSTRACT

Semiconductor devices, systems and methods are described. A semiconductor device can include a driver configured to output a gate current to drive a power module. The semiconductor device can further include a buffer configured to buffer a reference voltage that is less than a supply voltage being provided to the driver. The semiconductor device can further include a controller configured to determine a gate voltage of the power module is equivalent to the reference voltage. The controller can, in response to determination that the gate voltage is equivalent to the reference voltage, disable the driver to cause the driver to stop providing the gate current to the power module and enable the buffer to supply the reference voltage to the power module.

20 Claims, 8 Drawing Sheets

114
Power Module 320c
Buffer 304
Driver 306
Comparator 308
Reference Voltage Generator 310
Controller 302

PROGRAMMABLE GATE VOLTAGE FOR ON RESISTANCE CONTROL OF POWER MODULE

BACKGROUND OF THE SPECIFICATION

The present disclosure relates in general to semiconductor devices. More specifically, the present disclosure relates to using programmable gate voltage to control on resistance of power modules.

Gate drivers are used in switching converter applications such as DC/DC converters, inverters, motor drivers, etc. These system can include a controller, one or more power modules (e.g., switch elements) and gate drivers for each switches. The gate drivers drive their respective power modules to on and off states according to the controller's signal and the system provides required output voltage or power to the load.

SUMMARY

In one embodiment, a semiconductor device is generally described. The semiconductor device can include a driver configured to output a gate current to drive a power module. The semiconductor device can further include a buffer configured to buffer a reference voltage that is less than a supply voltage being provided to the driver. The semiconductor device can further include a controller configured to determine a gate voltage of the power module is equivalent to the reference voltage. The controller can be further configured to, in response to determination that the gate voltage is equivalent to the reference voltage, disable the driver to cause the driver to stop providing the gate current to the power module and enable the buffer to supply the reference voltage to the power module.

In one embodiment, a system in a switching converter is generally described. The system can include a first controller configured to generate a control signal. The system can further include a power module. The system can further include a gate driver configured to drive the power module according to the control signal. The gate driver can include a driver configured to output a gate current to drive the power module. The gate driver can further include a buffer configured to buffer a reference voltage that is less than a supply voltage being provided to the driver. The gate driver can further include a second controller configured to determine a gate voltage of the power module is equivalent to the reference voltage. The second controller can be further configured to, in response to determination that the gate voltage is equivalent to the reference voltage, disable the driver to cause the driver to stop providing the gate current to the power module and enable the buffer to supply the reference voltage to the power module.

In one embodiment, a method for operating a switching converter is generally described. The method can include outputting, by a gate driver, a gate current to drive a power module. The method can further include determining, by the gate driver, the gate voltage is equivalent to a reference voltage that is less than a supply voltage being provided to the gate driver. The method can further include, in response to determining that a gate voltage of the power module is equivalent to the reference voltage, disabling, by the gate driver, the output of the gate current to the power module and supplying, by the gate driver, the reference voltage to the power module.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, to provide an understanding of the various embodiments of the present application. However, it will be appreciated by one of ordinary skill in the art that the various embodiments of the present application may be practiced without these specific details. In other instances, well-known structures or processing steps have not been described in detail to avoid obscuring the present application.

Figure 1:
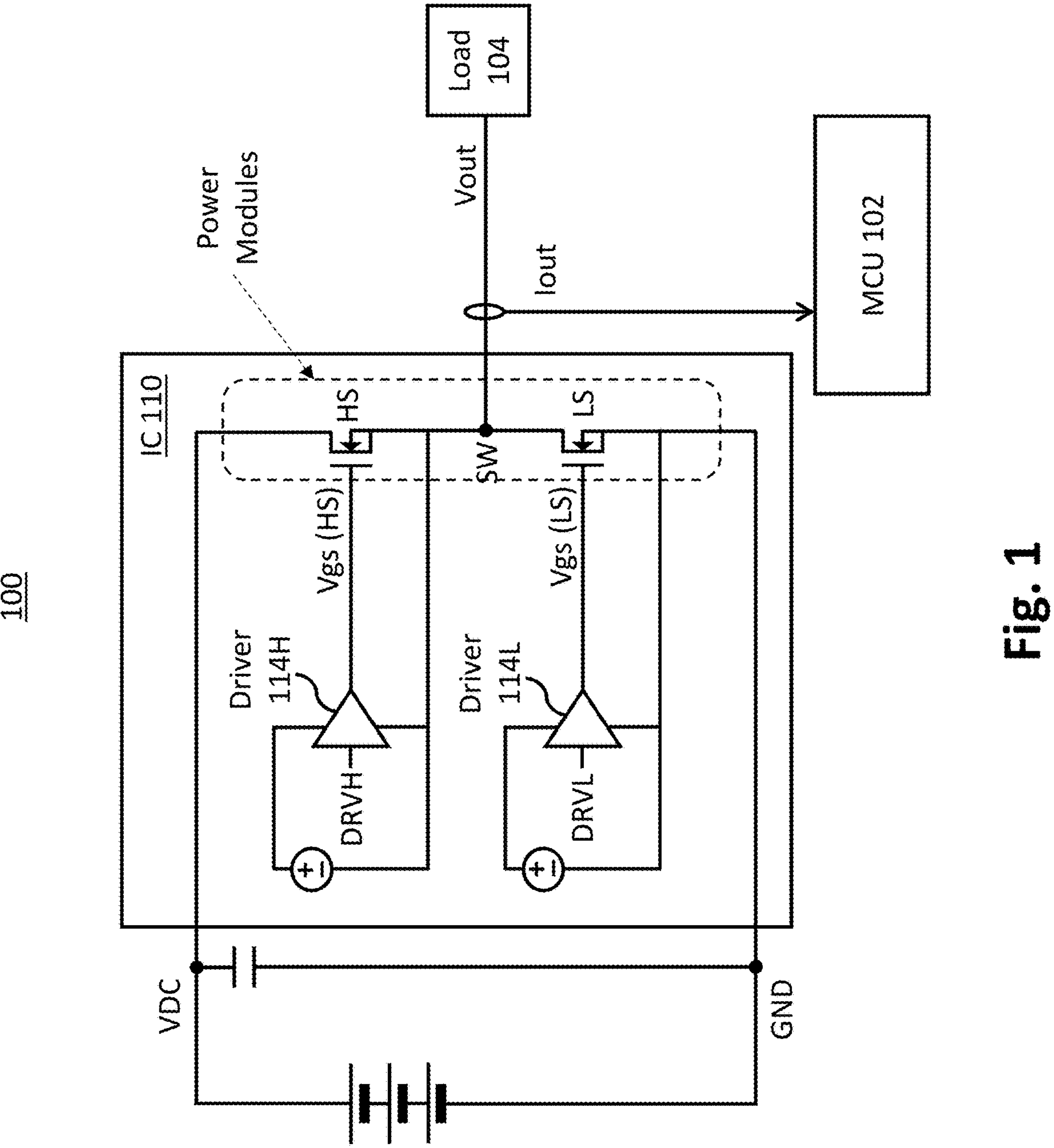
FIG. 1 is a diagram showing a system that can implement programmable gate voltage for on resistance control of power module in one embodiment.

FIG. 1 is a diagram showing a system that can implement programmable gate voltage for on resistance control of power module in one embodiment. An example system 100 shown in FIG. 1 can include at least a microcontroller (MCU) 102, an integrated circuit (IC) 110 and a load 104. System 100 can be used in various applications, including but not limited to, solenoid drivers, buck converters, boost converters, traction inverters, battery chargers (e.g., on-board chargers in electric vehicles), or various other applications that utilized a power converter. In one or more embodiments, IC 110 can include a plurality of components, such as individual ICs and power modules, mounted on the same printed circuit board (PCB).

IC 110 can include one or more power modules (e.g., switching elements) and gate drivers for driving the power modules to on and off states. In the example shown in FIG. 1, IC 110 can include one or more power modules, such as a high-side power module labeled as HS and a low-side power module labeled as LS. Power module HS can be connected between an input voltage labeled as VDC, where VDC can be a direct current (DC) voltage, and a switch node SW. Power module LS can be connected between the switch node SW and ground (GND). Each power module in IC 110 can be driven by a gate driver IC ("gate driver"). In the example shown in FIG. 1, a gate driver 114H can be configured to drive power module HS to on and off states and a gate driver 114L can be configured to drive power module LS to on and off states. Power modules HS and LS can be implemented by various devices, such as field-effect transistors (FETs) (e.g., metal oxide semiconductor field effect transistors (MOSFETs)) or various technologies (e.g., Silicon Carbide (SiC) devices), insulated-gate bipolar transistors (IGBTs), or other types of switching elements.

MCU 102 can be configured to generate control signals and provide the generated control signals (labeled as DRVH, DRVL in FIG. 1) to gate drivers 114H and 114L. In one or more embodiments, control signals DRVH, DRVL can be derived from pulse width modulation (PWM) signals, pulse density modulation (PDM) signals, space vector modulation (SVM) signals, or other types of control signals that can control gate drivers 114H and 114L. In one or more embodiments, MCU 102 can be implemented in software, hardware, or some combination thereof. MCU 102 can include one or more semiconductor devices (e.g., microcontroller, processor, control unit). Furthermore, MCU 102 may be part of another controller (e.g., central processing unit (CPU), main controller).

To drive the power modules to on and off states, the gate drivers can generate and supply gate current to the power modules (e.g., the power modules can be capacitive). A gate voltage, or gate-source voltage Vgs, to cause a power module to turn on or off can vary based on the gate current being provided by the gate driver. By way of example, when the control signal DRVH indicates turning on HS, gate driver 114H can generate a gate current Igate to turn on power module HS, where the gate voltage Vgs of HS can vary with this gate current Igate. When the control signal DRVH indicates turning off HS, gate driver 114H can discharge the gate-source voltage Vgs of HS to turn off power module HS. The power modules HS and LS can be turned off simultaneously, but cannot turn on simultaneously. The alternating on and off states of the power modules HS and LS can convert an input voltage (e.g., VDC) into an output voltage Vout. The output voltage Vout can be supplied to load 104 via the switch node SW. The output voltage Vout can drive an output current Iout from the switch node SW to load 104. Output current Iout can be fed back to MCU 102 and MCU 102 can use the measurement of Iout for various applications, such as regulating Vout at a desired voltage level.

Power conversion systems such as system 100 can face various challenges. In an aspect, a power module (e.g., IGBT, SiC device) can have an absolute maximum rating (e.g., maximum gate voltage) that can vary from product to product. When the supply voltage of the gate driver exceeds the absolute maximum rating of the power module, the gate driver cannot be used to drive the power module since the excessive supply voltage can damage the power module. Hence some conventional systems address this issue by adjusting the supply voltage of the gate drivers to prevent the supply voltage to exceed the absolute maximum rating of the power module. In another aspect, under different load conditions (e.g., different load current demands), thermal management can be performed where the on resistance of the power module can be adjusted in order to control power dissipation in the power module. Conventional systems can adjust the on resistance using programmable low-dropout (LDO) regulators. In another aspect, when a short circuit has occurred, adjustment to the on resistance can prevent damages to the power module. However, using programmable LDO regulators can be relatively slow and the on resistance adjustment to prevent power module damage during short circuit requires relatively fast response.

To be described in more detail below, the gate driver implementations presented herein can adjust the gate current, essentially adjusting or controlling the gate-source voltage Vgs, of a power module under various conditions. The adjustment to Vgs presented herein can allow full turn on and off without exceeding the absolute maximum ratings, hence eliminating the need to adjust the supply voltage adjustment for the gate drivers. Also, The adjustment to Vgs presented herein can provide relatively fast on resistance adjustment for thermal management and for short circuit situations.

Figure 2:
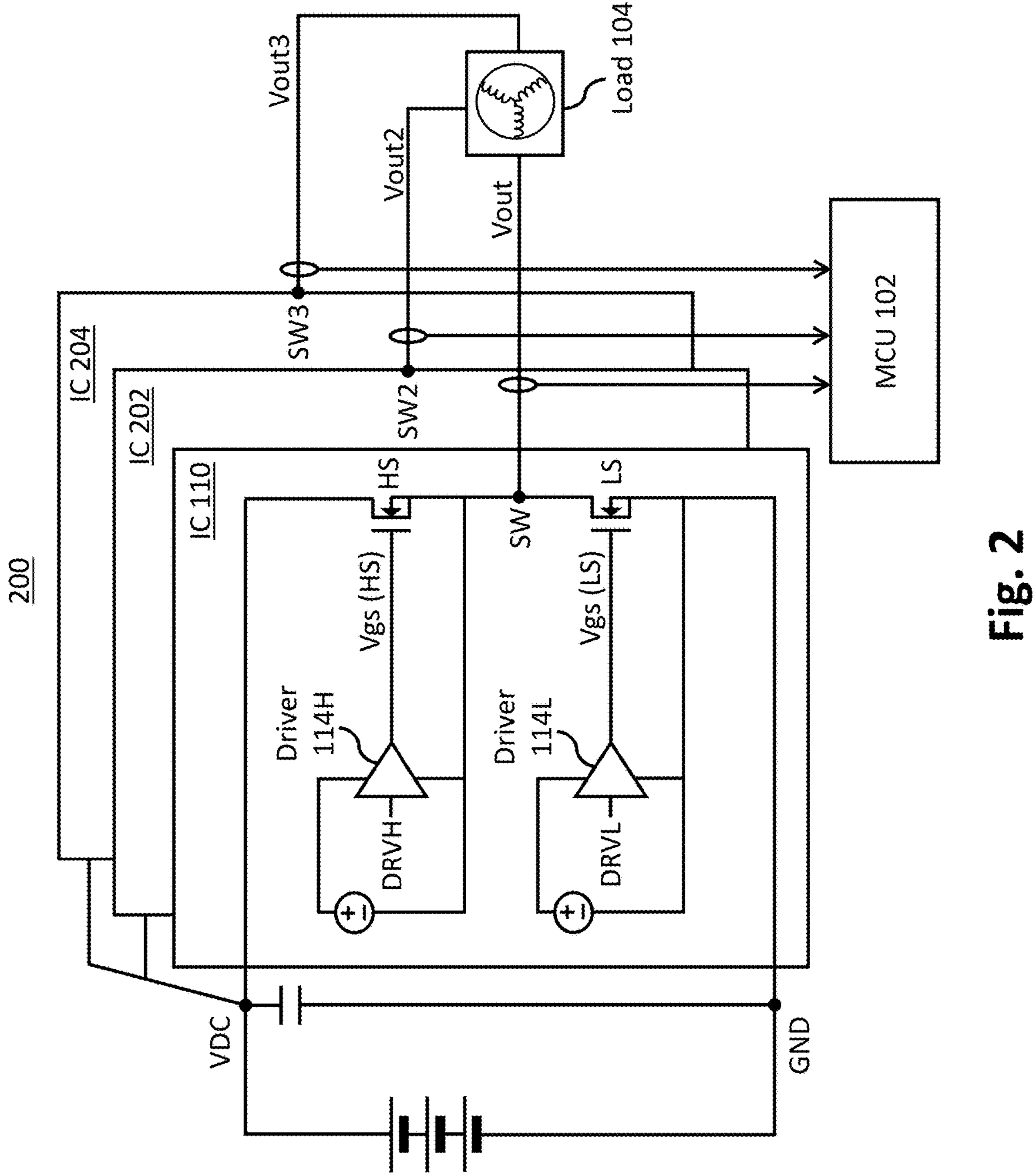
FIG. 2 is a diagram showing another system that can implement programmable gate voltage for on resistance control of power module in one embodiment.

FIG. 2 is a diagram showing another system that can implement programmable gate voltage for on resistance control of power module in one embodiment. Descriptions of FIG. 2 can reference components shown in FIG. 1. In an example shown in FIG. 2, a system 200 can be part of an electronic vehicle (EV). System 200 can include IC 110 and two additional copies of IC 110 (labeled as IC 202 and IC 204), MCU 102 and load 104. IC 202 and IC 204 are copies of IC 110 and include identical components as IC 110. In the example embodiment shown in FIG. 2, load 104 can be a rotor or a motor in an EV. In one embodiment, for EVs that has a brushless motor, load 104 can be a stator. System 100 can include a total of six drivers and six switches that controls the rotor. The rotor can include three coils, and each coil in the rotor can receive power as voltages Vout, Vout2, Vout3 from ICs 110, 202, 204 via switch nodes SW, SW2, SW3, respectively. Output currents from the switch nodes SW, SW2, SW3 can be sensed and fed back to MCU 102 for performing closed-loop control of the power being provided to the rotor. The Vgs control described herein can be performed by any one of the drivers in any one of IC 110, 202, 204.

Figure 3:
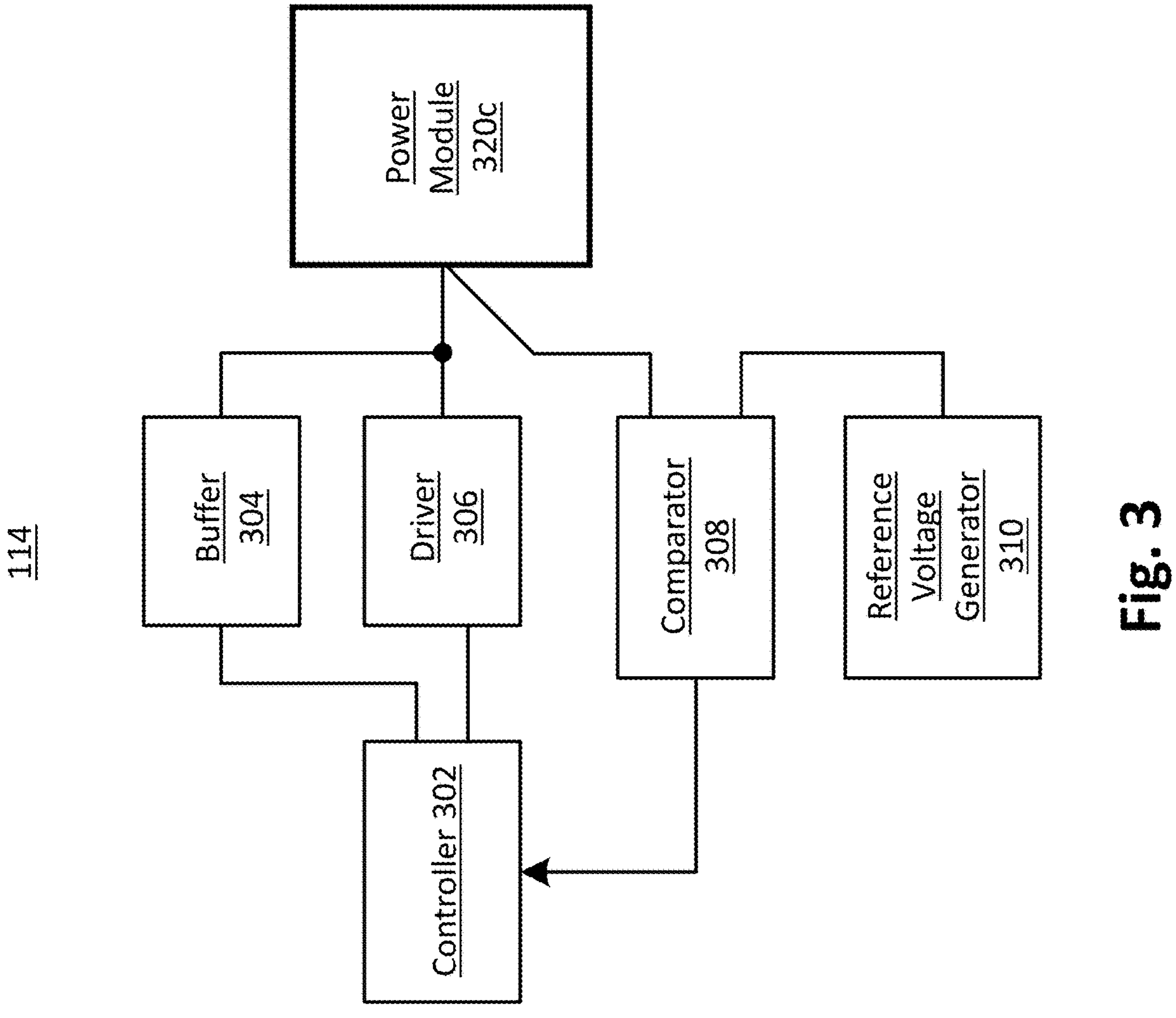
FIG. 3 is a diagram showing an example gate driver that can implement programmable gate voltage for on resistance control of power module in one embodiment.

FIG. 3 is a diagram showing an example gate driver that can implement programmable gate voltage for on resistance control of power module in one embodiment. Descriptions of FIG. 3 can reference components shown in FIG. 1 and FIG. 2. A gate driver 114 is shown in FIG. 3, where gate driver 114 can be any one of gate drivers 114H and 114L shown in FIG. 1, or any one of the six gate drivers in system 200 shown in FIG. 2. In the example embodiment shown in FIG. 3, gate driver 114 can be a circuit including at least a controller 302, a buffer 304, a driver 306, a comparator 308 and a reference voltage generator 310. Gate driver 114 can be configured to drive a power module 320, where power module 320 can be any one of power modules HS and LS shown in FIG. 1, or any one of the power modules of system 200 in FIG. 2.

Controller 302 can be a motor circuit implemented by an IC that may have relatively less functionality when compared to MCU 102. Controller 302 can be configured to control various aspects of gate driver 114. In one embodiment, MCU 102 can generate and provide commands to controller 302 to control operations of controller 302. Buffer 304 can be configured to maintain the gate voltage Vgs driving power module 320 at a target voltage level (or a reference voltage as described further below). Driver 306 can include components such as a pre-driver and switching elements for driving an output of the gate current Igate to power module 320. Comparator 308 can be configured to perform comparison between a reference voltage generated by reference voltage generator 310 with a measurement of the gate voltage Vgs. In one embodiment, MCU 102 can provide a digital value of the reference voltage to reference voltage generator 310. Reference voltage generator 310 can convert the digital value into the reference voltage that can be an analog voltage signal. The result of the comparisons performed by comparator 308 can be provided to controller 302. Controller 302 can use the comparison results to determine whether to perform one or more actions to adjust the control signals DRVH or DRVL to cause gate driver 114 to adjust a maximum value of Vgs (e.g., by adjusting Igate) in order to maintain Vgs at a target voltage level.

Figure 4:
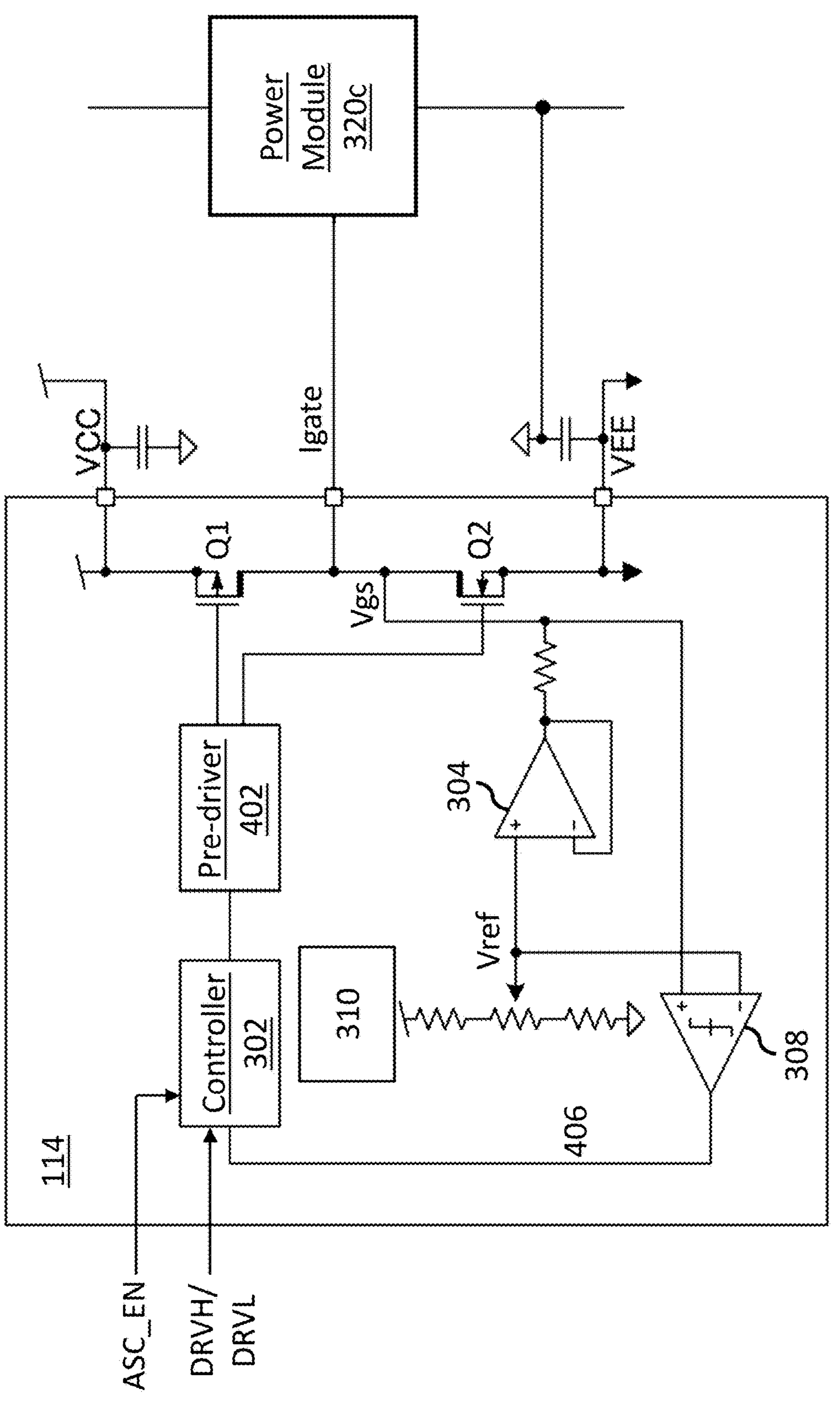
FIG. 4 is a diagram showing details of the example gate driver in FIG. 3 in one embodiment.

FIG. 4 is a diagram showing details of the example gate driver in FIG. 3 in one embodiment. Descriptions of FIG. 4 can reference components shown in FIG. 1 to FIG. 3. FIG. 4 shows example implementations of the components shown in FIG. 3. In FIG. 4, a pre-driver 402 and a pair of switching elements Q1, Q2 can be part of driver 306. Controller 302 can receive control signals, such as DRVH or DRVL shown in FIG. 1, from MCU 102 for driving power module 320. Controller 302 can convert the control signal into a gate voltage Vgs for turning on or off power module 320. The gate voltage Vgs can be provided to pre-driver 402. Pre-driver 402 can be configured to pre-process the gate voltage, such as performing one or more of voltage level shifting, signal conditioning, or amplification, and forward the pre-processed gate voltage to switching elements Q1, Q2. Switching elements Q1, Q2 can be complementary switching elements (e.g., complementary metal oxide semiconductor (CMOS) devices). When Q1 is turned on, Q2 is turned off and the voltage VCC will be pulled down to an output pin labeled GATE to turn on power module 320. In one embodiment, VCC can be the supply voltage for gate driver 114. When Q1 is turned off, Q2 is turned on and the output pin GATE will be pulled down to VEE or ground to turn off power module 320. In an aspect, under normal operating conditions (e.g., no short circuit detected by MCU 102), an active short circuit (ASC) enable signal, labeled as ASC_EN, can be set to low by MCU 102.

In one embodiment, a feedback of the gate voltage Vgs can be provided to a non-inverting input of comparator 308. A reference voltage Vref generated by reference voltage generator 310 can be provided to an inverting input of comparator 308 and to buffer 304. The voltage level of Vref can be programmable and provided by MCU 102. In one embodiment, MCU 102 can provide a digital value, such as a digital to analog converter (DAC) code, of Vref to reference voltage generator 310. Reference voltage generator 310 can include DAC and apply the DAC code on the DAC to select a resistance (e.g., tapping resistors connected in series) and output a current through the selected resistance to generate Vref. Comparator 308 can compare the feedback of Vgs with Vref and can generate a voltage difference 406. Comparator 308 can send voltage difference 406 to controller 302. When the gate voltage Vgs is equivalent to the reference voltage Vref, the voltage difference 406 will be zero. When controller 302 receives voltage difference 406 that is zero, controller 302 can determine that Vgs has reached the reference voltage Vref. In one embodiment, Vref can be less than VCC and greater than or equal to a threshold voltage of power module 320 (e.g., sufficient to turn on power module 320).

Under normal conditions (e.g., first operation mode), such as when no fault condition is detected, power module 320 can be turned on by charging the GATE output pin up to the reference voltage Vref, such that Vgs can vary between zero and Vref under normal conditions. By setting Vref as the maximum voltage level of Vgs, with Vref being less than VCC, situations where VCC exceeds the absolute maximum rating of the power module 320 can be reduced. Also, the gate driver 114 can be used for driving different power modules without changes to VCC. For power modules with lower absolute maximum ratings, the reference voltage Vref can be adjusted to a lower voltage level.

Power module 320 can undergo fault conditions at can be caused by, for example, over current condition or short circuit within the system (e.g., system 100 or system 200). Under these fault conditions, gate driver 114 can be configured to adjust Vgs in order to adjust the on resistance of power module 320. In an aspect, the on resistance varies inversely with the gate voltage Vgs. Thus, a decrease in Vgs can increase the on resistance of power module 320. By setting Vref according to a target on resistance, Vgs can be adjusted to Vref to achieve the target on resistance. The adjustment of Vgs to change the on resistance can be relatively fast when compared to conventional systems that uses LDO regulators to adjust on resistance.

When a fault condition occurs, MCU 102 can set the ASC enable signal ASC_EN to high. Controller 302 can detect the fault condition by reading the ASC_EN signal received from MCU 102. If controller 302 reads a zero or low from the ASC_EN signal, then controller 302 can determine that there is no fault condition. If controller 302 reads a non-zero voltage or high from the ASC_EN signal, then controller 302 can detect that there is a fault condition. If power module 320 is in an off state when the fault condition occurs, the ASC_EN signal being high can trigger an ASC turn-on mode (e.g., second operation mode). If power module 320 is in an on state when the fault condition occurs, the ASC_EN signal being high can trigger an ASC keep-on mode (e.g., third operation mode). Under the ASC turn-on mode, the gate voltage Vgs can be charged up (e.g., by Igate) to Vref instead of VCC. Under the ASC keep-on mode, the gate voltage Vgs can be reduced from VCC to Vref. When Vgs reaches Vref, as indicated by voltage difference 406 being equivalent to zero, controller 302 can disable driver 306, such as by commanding pre-driver 402 to turn off both Q1 and Q2, and controller 302 can enable buffer 304. The order to turn off Q1, Q2 and to enable buffer 304 can be arbitrary. By enabling buffer 304, Vref can be buffered to the GATE output pin such that Vgs can be maintained at Vref. Therefore, when there is a fault condition, Vgs can be limited to Vref that is less than VCC to reduce the risk of damaging power module 320. Also, when a fault condition occurs, the on resistance of power module 320 can be increased by decreasing Vgs to prevent damages to power module 320 (e.g., current spikes can cause damages). To decrease Vgs, Vref can be set to be less than VCC such that the maximum value of Vgs can be lowered and limited to increase the on resistance of power module 320. In one or more embodiments, controller 302 can disable buffer 304 to allow Vgs to vary between zero and VCC instead of Vref. In one or more embodiments, controller 302 can disable buffer 304 to allow Vgs to vary between zero and VCC instead of Vref.

Figure 5B:
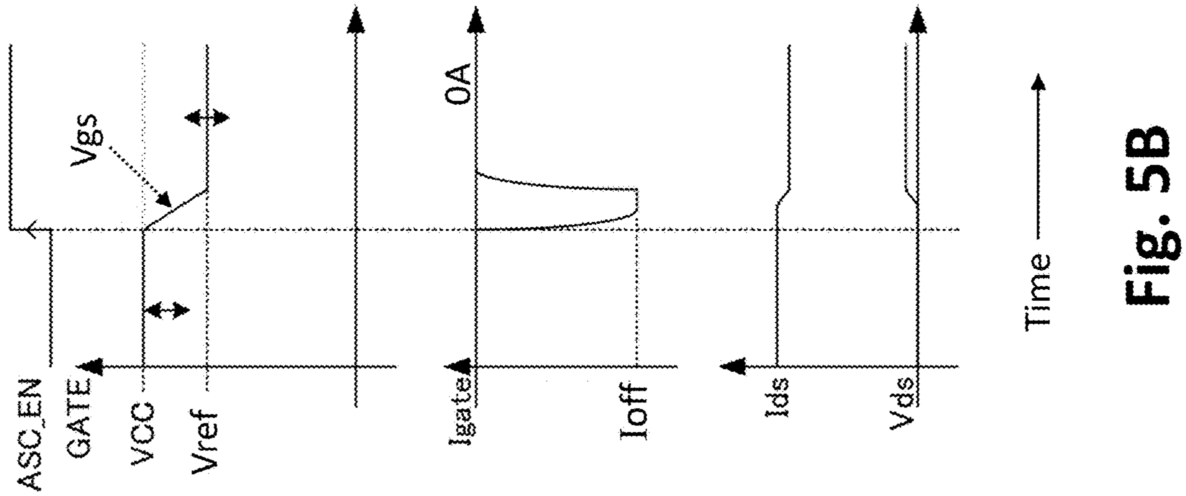
FIG. 5B is a diagram showing waveforms relating to an active short circuit keep-on mode during implementation of programmable gate voltage for on resistance control of power module in one embodiment.
Figure 5A:
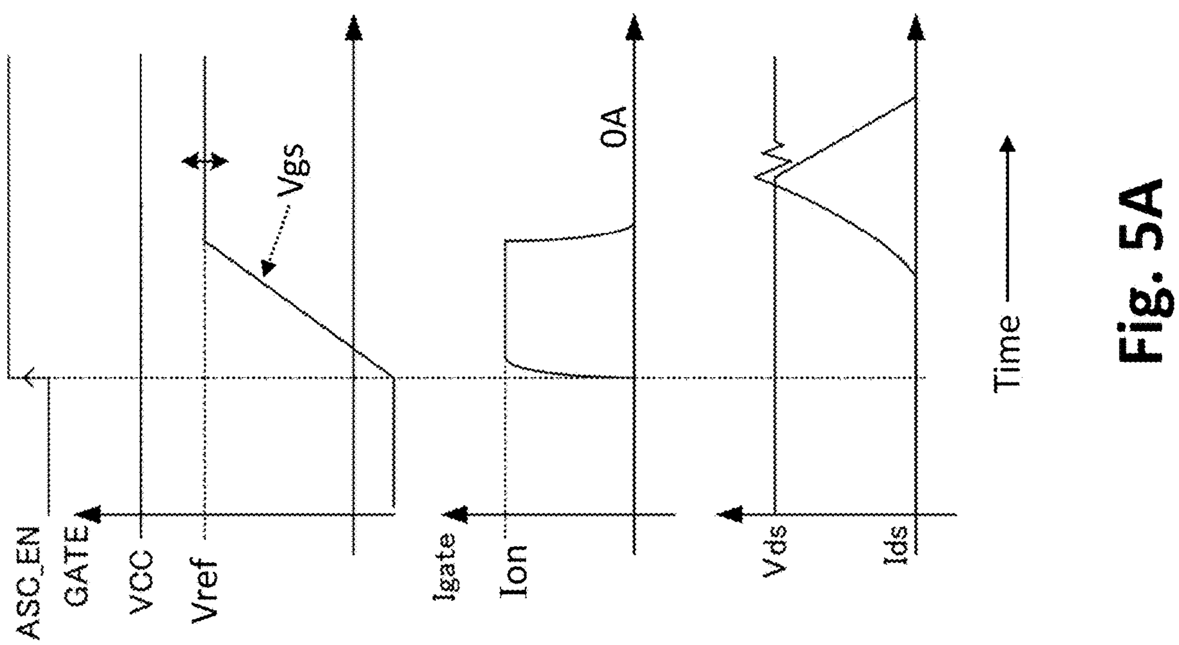
FIG. 5A is a diagram showing waveforms relating to an active short circuit turn-on mode during implementation of programmable gate voltage for on resistance control of power module in one embodiment.

FIG. 5A is a diagram showing waveforms relating to an active short circuit turn-on mode during implementation of programmable gate voltage for on resistance control of power module in one embodiment. Descriptions of FIG. 5A can reference components shown in FIG. 1 to FIG. 4. In the example waveforms shown in FIG. 5A, a fault condition can be detected by MCU 102 when power module 320 is in an off state (e.g., see non-zero Vds and zero Ids in FIG. 5A). When power module 320 is implemented in applications that requires power module 320 to transition from off state to on state in a fault condition, MCU 102 can set the ASC_EN signal to high to command controller 302 to turn on power module 320 immediately. By way of example, if load 104 is a rotor as shown in FIG. 2, when a fault condition is detected, all three high-side power modules need to be in the same state (on or off) and all three low-side power modules need to be in the same state (off or on) to achieve zero torque such that the system can address the fault condition.

Controller 302 in gate driver 114 can detect a fault condition by detecting a rising edge of the ASC_EN signal. Controller 302 in gate driver 114 can also determine whether power module 320 is in an on state or off state. By way of example, controller 302 can monitor Vgs. If Vgs is zero, then the power module is turned off. If Vgs is at a non-zero value that is relatively close to one or more of the threshold voltage of power module 320, VCC, and Vref, then the power module is turned on.

As shown in FIG. 5A, the rising edge of the ASC_EN signal can trigger pre-driver 402 to turn on switching element Q1, and turning on Q1 can trigger a current Igate to increase to a current Ion (e.g., Igate=Ion) in order to charge the voltage, or Vgs, at the GATE output pin. The current Igate can be the current flowing from the GATE output pin to power module 320. As Igate increases, Vgs also increases as shown in FIG. 5A. When the Vgs reaches Vref, controller 302 can disable driver 306, such as by commanding pre-driver 402 to turn off both switching elements Q1, Q2, hence Igate drops to zero and Vgs stops increasing. In order to maintain the voltage at the GATE output pin at Vref, when Vgs reaches Vref, controller 302 can enable buffer 304 such that Vref being generated by reference voltage generator 310 can be provided to the GATE output pin via the enabled buffer 304. Maintaining Vgs at Vref can allow power module 320 to remain in the on state (e.g., see zero Vds and non-zero Ids in FIG. 5A).

FIG. 5B is a diagram showing waveforms relating to an active short circuit keep-on mode during implementation of programmable gate voltage for on resistance control of power module in one embodiment. Descriptions of FIG. 5B can reference components shown in FIG. 1 to FIG. 5A. In the example waveforms shown in FIG. 5B, a fault condition can be detected by MCU 102 when power module 320 is in an on state (e.g., see zero Vds and non-zero Ids in FIG. 5A). When power module 320 is implemented in applications that requires power module 320 to transition from on state to off state in a fault condition, MCU 102 can set the ASC_EN signal to high to command controller 302 to turn off power module 320 immediately. By way of example, if load 104 is a rotor as shown in FIG. 2, when a fault condition is detected, all three high-side power modules need to be in the same state (on or off) and all three low-side power modules need to be in the same state (off or on) to achieve zero torque such that the system can address the fault condition.

As shown in FIG. 5B, a rising edge of the ASC_EN signal can trigger pre-driver 402 to turn on switching element Q2, and turning on Q2 can trigger a negative current Ioff as Igate (e.g., a negative current Ioff=Igate) to decrease or discharge the voltage, or Vgs, at the GATE output pin. As Igate decreases, Vgs also decreases as shown in FIG. 5B. When the Vgs reaches Vref, controller 302 can disable driver 306, such as by commanding pre-driver 402 to turn off both switching elements Q1, Q2, hence Igate reverts back to zero and Vgs stops decreasing. In order to maintain the voltage at the GATE output pin at Vref, when Vgs reaches Vref, controller 302 can enable buffer 304 such that Vref being generated by reference voltage generator 310 can be provided to the GATE output pin via the enabled buffer 304. Maintaining Vgs at Vref can allow power module 320 to remain in the on state.

Note that the example in FIG. 5B relates to the situation where power module 320 was turned on when the fault condition occurred. Hence, the decrease of Igate to Ioff was sufficient to turn off power module 320 for a period of time that allows the system (e.g., system 200) to achieve zero torque, and the system is reverted back to normal operation where power module 320 remains turned on using a Vgs=Vref (instead of Vgs=VCC). As shown in FIG. 5B, when Vgs decreases from VCC to Vref, the current Ids flowing through power module 320 decreases by a relatively small amount due to an increase in the on resistance (e.g., on resistance increases when Vgs decreases). Also, the voltage across the drain and source of power module 320 increases by a relatively small amount as well. The Ids and Vds changes allow power module 320 to remain in the on state after the temporary turn off.

Figure 6:
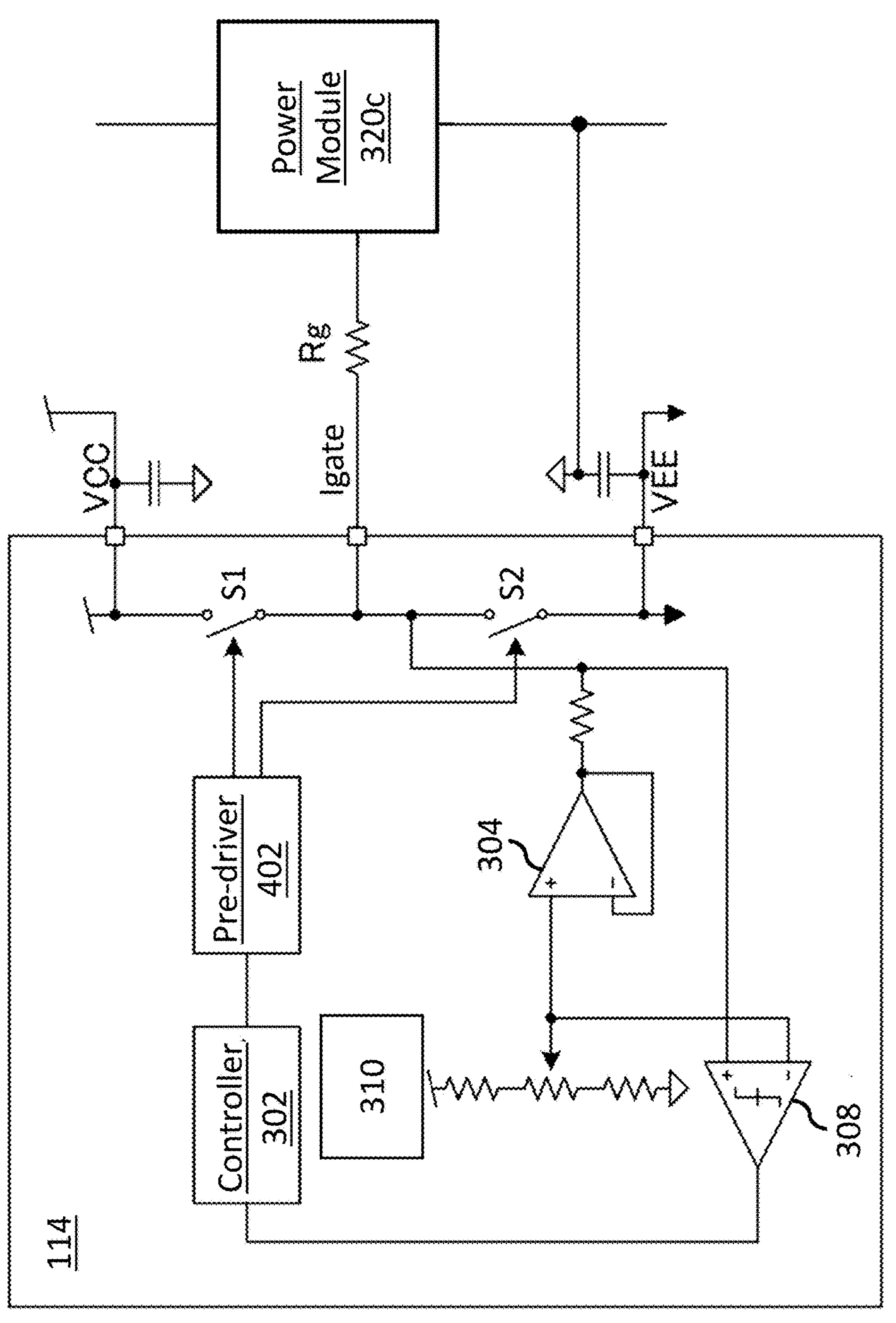
FIG. 6 is a diagram showing another example gate driver that can implement programmable gate voltage for on resistance control of power module in one embodiment.

FIG. 6 is a diagram showing another example gate driver that can implement programmable gate voltage for on resistance control of power module in one embodiment. Descriptions of FIG. 6 can reference components shown in FIG. 1 to FIG. 5B. The Vgs adjustment described herein can be applicable to different types of gate drivers. By way of example, in the embodiment shown in FIG. 6, driver 306 in gate driver 114 can be implemented by pre-driver 402 and a pair of switches S1, S2. Switches S1, S2 can be arbitrary type of switches that can be closed and opened using binary signals (e.g., analog signals such as high voltage and low voltage, or digital signal such as binary zero and binary one) and may not be complementary. When S1 is closed and S2 is opened, power module 320 is turned on. When S1 is opened and S2 is closed, then power module 320 is closed. An external gate resistor Rg can be connected between the GATE output pin and power module 320. The resistance value of Rg can be adjusted, such as by MCU 102, for various functions, such as controlling switching speed, preventing oscillation, protecting gate driver 114, or other functions.

Controller 302 can command pre-driver 402 to turn on power module 320 by closing switch S1 and opening switch S2 to pull VCC to the GATE output pin. Controller 302 can command pre-driver 402 to turn off power module 320 by opening switch S1 and closing switch S2 to discharge the GATE output pin. Under the normal condition, ASC turn-on mode and ASC keep-on modes mentioned above, when the voltage, or Vgs, at GATE output pin reaches Vref, controller 302 can disable driver 306, such as by commanding pre-driver 402 to open switch S1 (while S2 remains opened) and enable buffer 304 to maintain Vgs at Vref.

Figure 7:
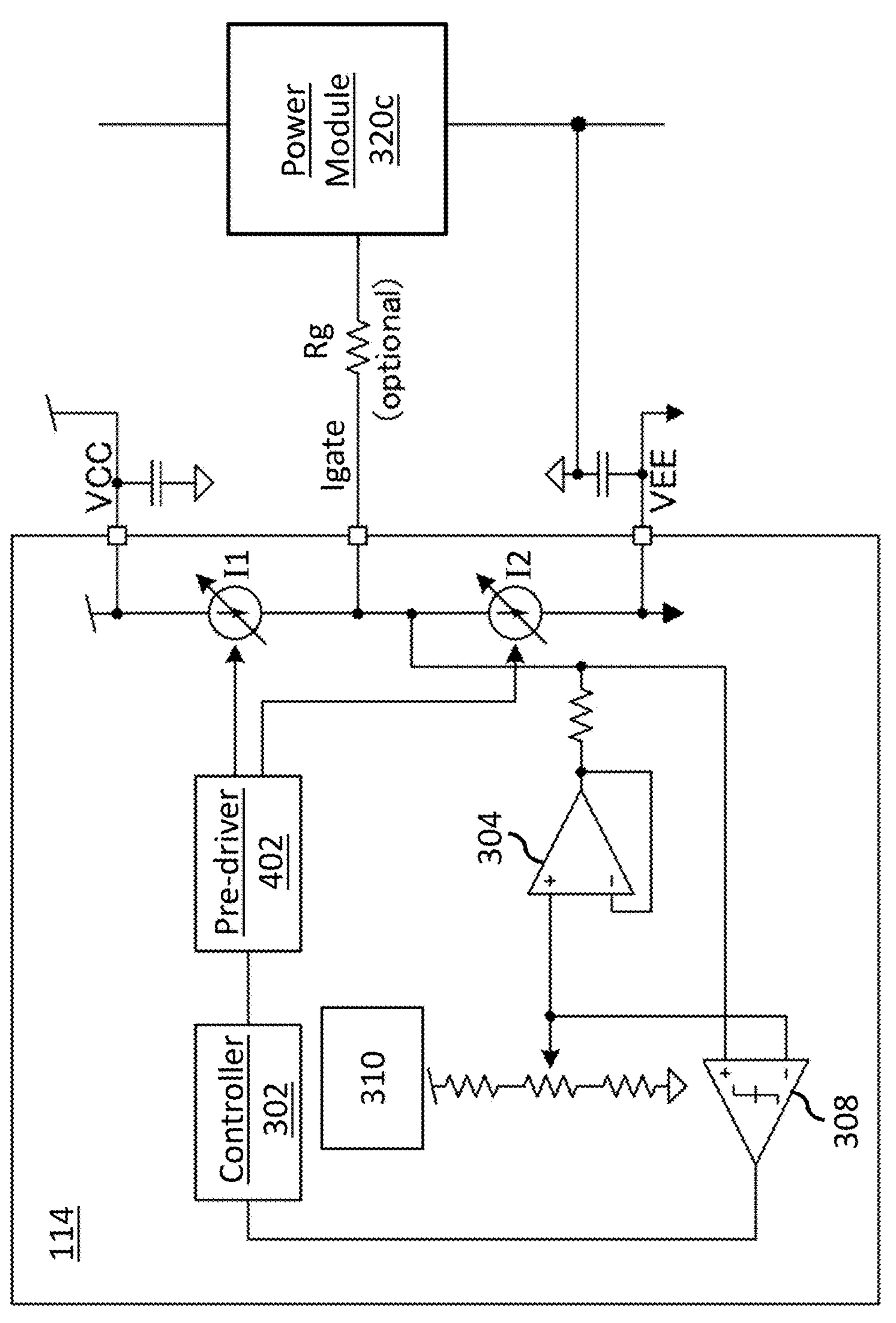
FIG. 7 is a diagram showing another example gate driver that can implement programmable gate voltage for on resistance control of power module in one embodiment.

FIG. 7 is a diagram showing another example gate driver that can implement programmable gate voltage for on resistance control of power module in one embodiment. Descriptions of FIG. 7 can reference components shown in FIG. 1 to FIG. 6. The Vgs adjustment described herein can be applicable to different types of gate drivers. By way of example, in the embodiment shown in FIG. 7, driver 306 in gate driver 114 can be implemented by pre-driver 402 and a pair of current sources I1, I2. Current sources I1, I2 can be controlled by pre-driver 402 to allow different amounts of current to flow among VCC, GATE, and VEE. The external gate resistor Rg can be optionally included for various functions, such as controlling switching speed, preventing oscillation, protecting gate driver 114, or other functions.

Controller 302 can command pre-driver 402 to turn on power module 320 by enabling current source I1 to generate current that can drive the voltage at GATE output pin to increase while disabling current source I2. Controller 302 can command pre-driver 402 to turn off power module 320 by disabling current source I1 and enabling current source I2 to generate current that can discharge the GATE output pin to VEE. Under the normal condition, ASC turn-on mode and ASC keep-on modes mentioned above, when the voltage, or Vgs, at GATE output pin reaches Vref, controller 302 can disable driver 306, such as by commanding pre-driver 402 to disable both current sources I1, I2 and enable buffer 304 to maintain Vgs at Vref.

Figure 8:
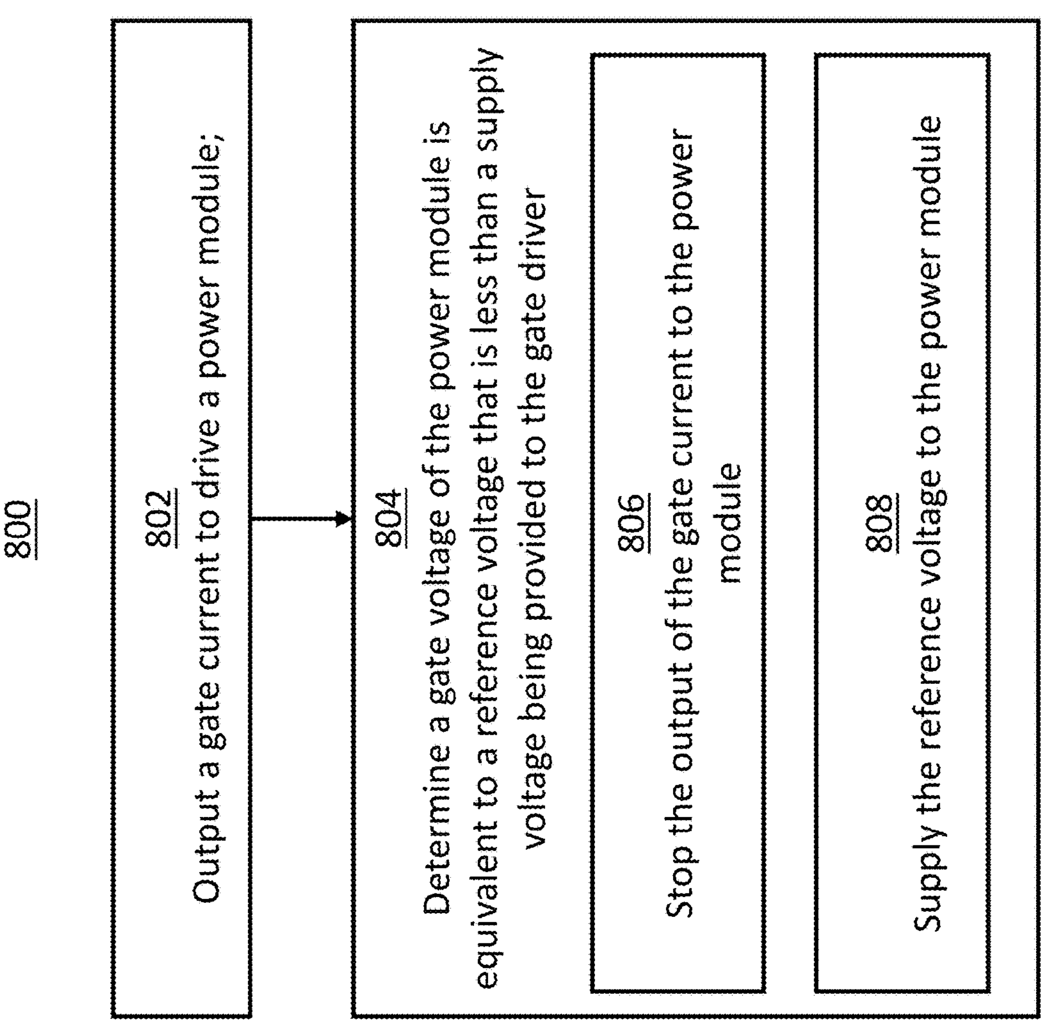
FIG. 8 illustrates a flow diagram of a process to implement programmable gate voltage for on resistance control of power module in one embodiment.

FIG. 8 illustrates a flow diagram of a process to implement programmable gate voltage for on resistance control of power module in one embodiment. The process 800 shown in FIG. 8 can include one or more operations, actions, or functions as illustrated by one or more of blocks 802, 804, 806 and/or 808. Although illustrated as discrete blocks, various blocks can be divided into additional blocks, combined into fewer blocks, eliminated, performed in different order, or performed in parallel, depending on the desired implementation.

Process 800 can be performed by a gate driver, such as gate drivers 114, 114H, 114L, or other gate drivers as described herein. Process 800 can begin at block 802. At block 802, a gate driver can output a gate voltage to drive a power module. Process 800 can proceed from block 802 to block 804. At block 804, the gate driver can determine the gate voltage is equivalent to a reference voltage that is less than a supply voltage being provided to the gate driver. In one embodiment, the gate driver can determine that the gate voltage is equivalent to the reference voltage during a transition from an off state of the power module to an on state of the power module. In one embodiment, the gate driver can determine the gate voltage is equivalent to the reference voltage by comparing the gate voltage with the reference voltage and generating a voltage difference between the gate voltage and the reference voltage. The gate driver can use the voltage difference to determine the gate voltage is equivalent to the reference voltage. In one embodiment, the reference voltage can be greater than a threshold voltage of the power module. In one embodiment, the reference voltage can be programmable based on a target on resistance of the power module.

Process 800 can proceed from block 802 to block 804. At block 804, in response to determining that the gate voltage is equivalent to the reference voltage, process 800 can proceed to one of blocks 806 and 808. Blocks 806 and 808 can be performed in an arbitrary order. At block 806, the gate driver can disable the output of the gate voltage to the power module; and At block 808, the gate driver can supply the reference voltage to the power module.

In one embodiment, the gate driver can detect a fault condition and determine that the power module is in an off state. In response to detection of the fault condition and determination that the power module is in the off state, the gate driver can increase the gate voltage. The gate driver can determine the gate voltage is increased to the reference voltage. In response to determination that the gate voltage is increased to the reference voltage, the gate driver can disable the driver to cause the driver to stop providing the gate voltage to the power module and enable the buffer to supply the reference voltage to the power module to turn on the power module.

In one embodiment, the gate driver can detect a fault condition and determine that the power module is in an on state. The gate driver can, in response to detection of the fault condition and determination that the power module is in the on state, decrease the gate voltage. The gate driver can determine the gate voltage is decreased to the reference voltage. In response to determination that the gate voltage is decreased to the reference voltage, the gate driver can disable the driver to cause the driver to stop providing the gate voltage to the power module and enable the buffer to supply the reference voltage to the power module to maintain the power module in the on state.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:

a driver configured to output a gate voltage to drive a power module;

a buffer configured to buffer a reference voltage that is less than a supply voltage being provided to the driver; and a controller configured to:

determine the gate voltage is equivalent to the reference voltage; and in response to determination that the gate voltage is equivalent to the reference voltage:

disable the driver to cause the driver to stop providing the gate voltage to the power module; and enable the buffer to supply the reference voltage to the power module to maintain the gate voltage of the power module at the reference voltage while the driver is disabled.

2. The semiconductor device of claim 1, further comprising a reference voltage generator configured to:

generate the reference voltage; and provide the reference voltage to the buffer.

3. The semiconductor device of claim 1, further comprising a comparator configured to:

compare the gate voltage with the reference voltage; and output a voltage difference between the gate voltage and the reference voltage to the controller, wherein the controller is configured to use the voltage difference to determine the gate voltage is equivalent to the reference voltage.

4. The semiconductor device of claim 1, wherein the controller is configured to determine that the gate voltage is equivalent to the reference voltage during a transition from an off state of the power module to an on state of the power module.

5. The semiconductor device of claim 1, wherein the controller is configured to:

detect a fault condition;

determine that the power module is in an off state;

in response to detection of the fault condition and determination that the power module is in the off state:

control the driver to increase the gate voltage;

determine the gate voltage is increased to the reference voltage;

in response to determination that the gate voltage is increased to the reference voltage:

disable the driver to cause the driver to stop providing the gate voltage to the power module; and enable the buffer to supply the reference voltage to the power module to turn on the power module.

6. The semiconductor device of claim 1, wherein the controller is configured to:

detect a fault condition;

determine that the power module is in an on state;

in response to detection of the fault condition and determination that the power module is in the on state:

control the driver to decrease the gate voltage;

determine the gate voltage is decreased to the reference voltage;

in response to determination that the gate voltage is decreased to the reference voltage:

disable the driver to cause the driver to stop providing the gate voltage to the power module; and enable the buffer to supply the reference voltage to the power module to maintain the power module in the on state.

7. The semiconductor device of claim 1, wherein the reference voltage is greater than a threshold voltage of the power module.

8. The semiconductor device of claim 1, wherein the reference voltage is programmable based on a target on resistance of the power module.

9. A system comprising:

a first controller configured to generate a control signal;

a power module;

a gate driver configured to drive the power module according to the control signal, the gate driver comprising:

a driver configured to output a gate voltage to drive the power module;

a buffer configured to buffer a reference voltage that is less than a supply voltage being provided to the driver; and a second controller configured to:

determine the gate voltage is equivalent to the reference voltage; and in response to determination that the gate voltage is equivalent to the reference voltage:

disable the driver to cause the driver to stop providing the gate voltage to the power module; and enable the buffer to supply the reference voltage to the power module to maintain the gate voltage of the power module at the reference voltage while the driver is disabled.

10. The system of claim 9, wherein the gate driver further comprises a reference voltage generator configured to:

generate the reference voltage; and provide the reference voltage to the buffer.

11. The system of claim 9, wherein the gate driver further comprises a comparator configured to:

compare the gate voltage with the reference voltage; and output a voltage difference between the gate voltage and the reference voltage to the second controller, wherein the second controller is configured to use the voltage difference to determine the gate voltage is equivalent to the reference voltage.

12. The system of claim 9, wherein the second controller is configured to determine that the gate voltage is equivalent to the reference voltage during a transition from an off state of the power module to an on state of the power module.

13. The system of claim 9, wherein the second controller is configured to:

detect a fault condition of the system;

determine that the power module is in an off state;

in response to detection of the fault condition and determination that the power module is in the off state:

control the driver to increase the gate voltage;

determine the gate voltage is increased to the reference voltage;

in response to determination that the gate voltage is increased to the reference voltage:

disable the driver to cause the driver to stop providing the gate voltage to the power module; and enable the buffer to supply the reference voltage to the power module to turn on the power module.

14. The system of claim 9, wherein the second controller is configured to:

detect a fault condition of the system;

determine that the power module is in an on state;

in response to detection of the fault condition and determination that the power module is in the on state:

control the driver to decrease the gate voltage;

determine the gate voltage is decreased to the reference voltage;

in response to determination that the gate voltage is decreased to the reference voltage:

disable the driver to cause the driver to stop providing the gate voltage to the power module; and enable the buffer to supply the reference voltage to the power module to maintain the power module in the on state.

15. The system of claim 9, wherein the reference voltage is greater than a threshold voltage of the power module.

16. The system of claim 9, wherein the reference voltage is programmable based on a target on resistance of the power module.

17. A method comprising:

outputting, by a gate driver, a gate voltage to drive a power module;

determining, by the gate driver, the gate voltage is equivalent to a reference voltage that is less than a supply voltage being provided to the gate driver; and in response to determining that the gate voltage is equivalent to the reference voltage:

disabling, by the gate driver, the output of the gate voltage to the power module; and supplying, by the gate driver, the reference voltage to the power module to maintain the gate voltage of the power module at the reference voltage while the output of the gate voltage is disabled.

18. The method of claim 17, wherein determining the gate voltage is equivalent to the reference voltage comprises:

comparing, by the gate driver, the gate voltage with the reference voltage; and generating, by the gate driver, a voltage difference between the gate voltage and the reference voltage; and using, by the gate driver, the voltage difference to determine the gate voltage is equivalent to the reference voltage.

19. The method of claim 17, wherein the reference voltage is greater than a threshold voltage of the power module.

20. The method of claim 17, wherein the reference voltage is programmable based on a target on resistance of the power module.

* * * * *